United States

Wauk, II

[11] 4,016,512

[45] Apr. 5, 1977

[54] WIDE BAND BULK ACOUSTIC WAVE DELAY LINE

[75] Inventor: Michael T. Wauk, II, Agoura, Calif.

[73] Assignee: Hughes Aircraft Company, Culver City, Calif.

[22] Filed: Oct. 2, 1975

[21] Appl. No.: 619,096

[52] U.S. Cl. .................. 333/30 R; 310/8; 310/8.5; 310/9.5

[51] Int. Cl.² .................. H03H 9/30; H01L 41/10; H01L 41/18

[58] Field of Search .............. 333/30 R; 310/8, 8.1, 310/8.5, 8.2, 9.5

[56] References Cited

UNITED STATES PATENTS

| | | | |
|---|---|---|---|
| 2,624,804 | 1/1953 | Arenberg | 333/30 R |
| 2,839,731 | 6/1958 | McSkimin | 333/30 R |

Primary Examiner—Alfred E. Smith
Assistant Examiner—Marvin Nussbaum
Attorney, Agent, or Firm—John Holtrichter, Jr.; W. H. MacAllister

[57] ABSTRACT

A bulk acoustic wave delay line including a body of acoustic wave supporting material and having at least one planar surface capable of reversably converting longitudinal wave mode acoustic energy to shear wave mode acoustic energy, the delay line also including at least one transducer for converting electromagnetic wave energy to acoustic wave energy and vice versa for propagating said acoustic wave energy along a path, a major portion of which supports shear wave mode energy and which path is at least partially defined by the mode converting planar surface, the planar surface being treated to increase the attenuation of propagating acoustic wave energy thereat by a predetermined amount, the attenuation provided at said planar surface being relatively frequency independent as compared to the attenuation per unit time of the propagating acoustic wave energy in the delay line body whereby triple transit signal suppression is significantly increased while still maintaining a relatively wide band frequency response.

18 Claims, 5 Drawing Figures

WIDE BAND BULK ACOUSTIC WAVE DELAY LINE

BACKGROUND OF THE INVENTION

The background of the invention will be set forth in two parts.

1. FIELD OF THE INVENTION

This invention relates to delay lines and more specifically to bulk acoustic wave delay lines.

2. DESCRIPTION OF THE PRIOR ART

The usefulness of propagating elastic wave energy in solids has been known for many years and is generally known as microwave acoustic technology. Utilizing this technology, such devices which store and delay signals have been developed to a relatively high degree. Many texts are presently available which thoroughly describe the history and advancements of this art, such as, for example, "Ultrasonic Methods In Solid State Physics" by Rohn Truell, Charles Elbaum and Bruce B. Chick, Academic Press, 1969.

Probably of greatest interest in the field of bulk wave devices has been the bulk acoustic wave delay lines. Unlike surface acoustic wave delay lines in which most of the energy propagating along an elastic surface is converted to electromagnetic wave energy upon reaching a state of the art transducer, only about 10% of the propagating bulk wave energy is converted at an output transducer, the rest being reflected back toward the input transducer. This relatively strong reflected wave is again reflected, at the input transducer, and is incident on the output transducer to produce a relatively strong spurious signal known generally as the triple-transit signal.

Although there was at first much interest in bulk acoustic wave devices because they are more adaptable for operation in the multi-gigahertz range as compared to surface acoustic wave devices (usually limited to about 500 MHz), the problem of the triple transit signal has caused a decrease in such interest. The problem of triple transit signals has become more severe as techniques were developed which reduced the attenuation per unit time of propagating acoustic wave energy so as to increase its relatively narrow bandwidth characteristic, as will be described hereinafter.

Attenuation is required in order to reduce this echo problem because it more greatly affects the multiple path triple transit echo signal than the single transit main signal. However, the increase of attenuation per unit time of the propagating energy in the solid is extremely frequency dependent. That is, the attenuation $\alpha$ in dB per microsecond is proportional to $f^2$, where f is the frequency of the propagating acoustic wave energy. Thus a 5 dB attenuation of this type at 5 GHz will be approximately 20 dB at 10 GHz. This $f^2$ dependence is more completely discussed in such articles as "On the Absorption of Sound in Solids" by A. Akhieser in The Journal of Physics (USSR), Vol. 1, Page 277 (1939), and in "Absorption of Sound in Insulators" by T. O. Woodruff and H. Ehrenreich, in Physical Review, Vol. 123, page 1553 (1961).

Several techniques have been developed in order to lessen the overall frequency dependent attenuation and thereby increase the bandwidth of the device. The lowest presently known room temperature attenuation at 10 GHz occurs in magnesium aluminum spinel ($MgAl_2O_4$), which is $\alpha = 8$ dB/usec. Through cooling the solid to very low temperatures of about one-fifth of its Debye temperature (about 180°K), this attenuation is reduced to a much lower level, and this greatly improves the bandwidth. However, the triple transit signal is no longer suppressed. It has been found that the main delayed output signal and the triple transit output signal for a double ended bulk delay line, as shown in FIG. 1, is about $2\alpha L$ in dB, where L is the length of the path between transducers.

For a more complete discussion of the affect of lowered temperatures on the attenuation of propagating acoustic waves in elastic solids, reference may be made to an article entitled "Temperature Dependence on Microwave Phonon Attenuation" by M. Pomerantz in Physical Review, Vol. 139, A501 (1965) at page 22.

Another technique which has been developed in an effort to reduce the overall attenuation is to utilize mode converting surfaces which convert a longitudinal or compressional bulk wave to a shear or transverse bulk wave. This technique uses the well-known principle that longitudinal waves can be converted to shear waves by reflection off of a free surface disposed at a predetermined angle with respect to the incident wave. Delay lines utilizing this scheme use a transducer to generate and receive the longitudinal waves while the substantial part of the propagating acoustic wave energy traverses the device in the shear wave mode. This scheme, along with the cooling technique, substantially reduces this $f^2$ bandwidth problem but, as mentioned before, increases the triple transit problem. It should therefore be evident that a new technique which will maintain a relatively wide bandwidth characteristic in a bulk delay line while providing a relatively high triple transit signal suppression would constitute a significant advancement in the art.

SUMMARY OF THE INVENTION

In view of the foregoing factors and conditions characteristic of the prior art, it is a primary object of the present invention to provide an improved bulk acoustic wave delay line.

Another object of the present invention is to provide a relatively wide band bulk acoustic wave delay line having relatively overall low attenuation with a high degree of triple transit signal energy suppression.

In accordance with an embodiment of the present invention, a wide band bulk acoustic wave delay line is provided having a body of material capable of supporting propagating longitudinal and shear wave modes of acoustic energy. The body includes at least one longitudinal-shear wave mode converting wall defining a relatively long but relatively low-attenuation shear wave mode propagation path within the body angularly disposed with respect to the plane of the mode converting wall. The delay line includes transducer means disposed on the body for converting electromagnetic wave energy to acoustic wave energy and the converse thereof, and for directing and receiving propagating longitudinal wave mode acoustic energy to and from the mode converting wall along relatively short but relatively higher attenuation longitudinal wave mode propagation paths within the body angularly disposed with respect to the plane of the mode converting wall and to the shear wave mode propagation path, the attenuation of the propagating acoustic wave energy in the body being relatively frequency dependent. The delay line of the invention also includes mode conversion disturbance means associated with the mode converting wall for relatively frequency-independently increasing the attenuation of the propagating acoustic wave energy at the mode converting wall.

The conversion disturbance means may be irregularities in the surface of the mode converting wall made by such procedures as mechanical abrasion, chemical etching or ion beam machining, for example. Also the conversion disturbance means may be provided by depositing or plating a film of a metal or dielectric material, for example.

In accordance with embodiments of the invention, the delay line body is cooled to the cryogenic range, and the transducer means may include one and preferably two transducers for transmitting and receiving acoustic wave energy and converting same to electromagnetic energy.

The features of the present invention which are believe to be novel are set forth with particularity in the appended claims. The present invention, both as to its organization and manner of operation, together with further objects and advantages thereof, may best be understood by making reference to the following description taken in conjunction with the accompanying drawings in which like reference characters refer to like elements in the several views.

Figure 1:
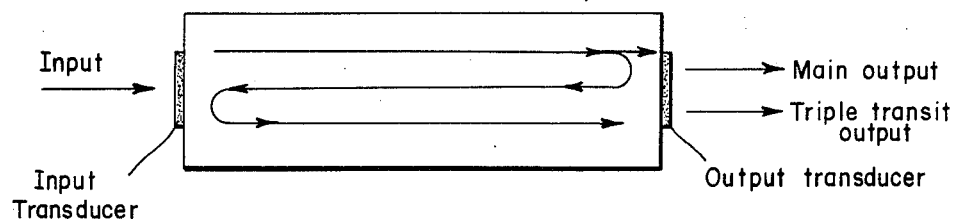
FIG. 1 is a schematic illustration of a bulk acoustic wave delay line exemplifying the prior art.
Figure 2:
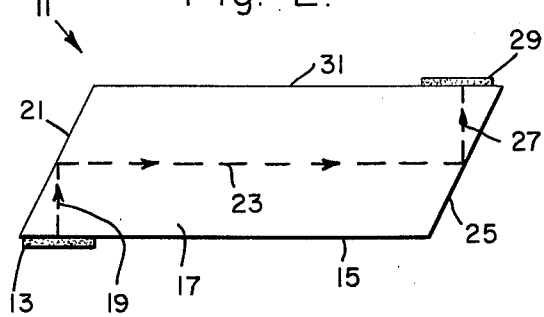
FIG. 2 is a schematic view of a wide band bulk acoustic wave delay line constructed in accordance with one embodiment of the present invention.

DESCRIPTION OF THE PREFERRED EMBODIMENTS:

Referring now to the drawings and more particularly to the exemplification of the prior art shown in FIG. 1, it can be seen that in bulk acoustic wave devices the acoustic wave energy generated by an input transducer reflects from the planar end surfaces to a high degree, and only a very low percentage of the main energy is coupled out of the solid body through an output transducer as a main output signal. On the other hand, nearly 90% of the propagating acoustic wave energy in the solid is reflected by the planar end surfaces of the solid. Thus, the main beam energy reflected by the end surface at the right again reflects out the planar end surface at the left and is again incident on the output transducer where it is presented as a relatively strong spurious triple transit output signal. In order to overcome this distinct disadvantage, an embodiment 11 of the present invention, illustrated in FIG. 2, provides a conventional input transducer 13 disposed on a planar surface 15 of a solid body 17. The body in this embodiment is in the form of an oblique rectangular parallelepiped, and is any material capable of supporting propagating longitudinal and shear wave modes of acoustic energy, such as magnesium aluminate spinel for example.

As seen in FIG. 2, acoustic wave energy generated by the input transducer 13 in response to electromagnetic energy coupled to the transducer from a conventional source (not shown) propagates in a compressional or longitudinal mode along a relatively short first path 19 toward a first angularly disposed mode converting wall 21 which converts the propagating energy to a transverse or shear mode along a second relatively long path 23 toward a second angularly disposed mode converting wall 25. The acoustic energy is here converted back to longitudinal mode energy which propagates along a relatively short third path 27 to a conventional output trandsucer 29 disposed on another planar surface 31 of the body 17. Thus, the acoustic energy propagates mostly in a relatively low attenuation shear wave mode, and if the body is cooled to a relatively low temparature, the $f^2$ dependent attenuation is significantly reduced to provide a relatively wide band device.

However, as indicated previously, the reduction of overall attenuation in the delay line also eliminates the triple transit suppression. In order to increase this suppression without narrowing the bandwidth of the device, the present invention contemplates the introduction of a predetermined amount of attenuation which is relatively independent of frequency. This is accomplished by reducing the efficiency of longitudinal-shear wave mode conversion at one or both of the mode conversion walls. This may be provided in many ways such as processing the surface of the wall or walls by mechanical abrasion, chemical etching, ion beam machining, and the like. Also, as an alternate to damaging the crystal surface, a thin film of metal or a dielectric material may be deposited on the wall's surface. The effect of this disturbance is to increase signal loss by × dB, and the triple transit signal loss by 3× dB. Thus, it can be seen that the triple transit suppression is improved by 2× dB, without a reduction of bandwidth.

Figure 3:
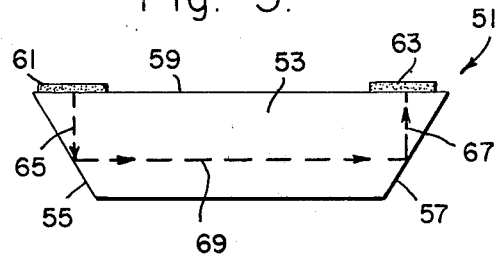
FIG. 3 is a schematic view of a presently preferred embodiment of the present invention.

Referring now to FIG. 3, there is shown a presently preferred embodiment 51 of the invention. Here, the body 53 of elastic material is in the form of a polyhedron with oppositely inclined polygonal ends 55 and 57 and an upper planar surface 59 at opposite ends of which are respectively disposed an input transducer 61 and an output transducer 63. Propagating acoustic wave energy leaving the input transducer 61 along a relatively short path 65, and such energy arriving at the output transducer 63 via a likewise short path 67, is in a longitudinal wave mode, while the energy propagating along a relatively long path 69 between and reflected at the ends 55 and 57 is in a shear wave mode. The end planar surfaces 55 and 57 are disposed at predetermined angles with respect to desired propagation paths so as to act as longitudinal-shear wave mode conversion planes or walls so that the acoustic wave energy in the body 59 propagates, for the most part, in a shear wave mode in order to lower the frequency-dependent ($f^2$) attenuation factor discussed previously. In order to provide the necessary attenuation (per unit time) for good triple transit signal suppression without sacrificing bandwidth, one or both of the mode converting walls 55, 57 are processed to exhibit the relatively low frequency dependent attenuation described in the first embodiment of the invention.

It can be seen from FIGS. 2 and 3, that in the last described embodiment, propagation path is in the form of a square-U shape, with the possibility of having shorter longitudinal wave mode paths than is possible in the generally z-shaped path of the first described embodiment. In all other respects, these devices function alike.

Figure 4:
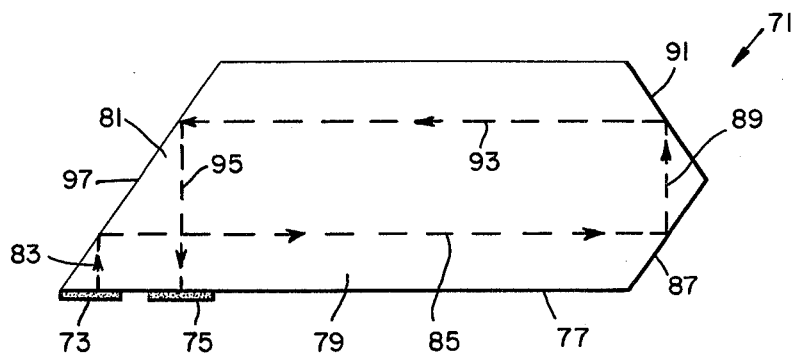
FIG. 4 schematically illustrates still another embodiment of the invention.

Another embodiment is shown in FIG. 4. Here the delay line 71 utilizes separate input and output transducers 73 and 75 disposed on a single planar surface 77 of a polyhedron body 79. The transducers are disposed adjacent each other and adjacent a previously described mode converting surface or wall 81 so that longitudinal wave mode energy leaving the input transducer 73 along a first path 83 is reflected and simultaneously converted to a shear wave mode by the wall 81 to propagate along a relatively longer path 85 toward a second mode converting wall 87. Shear wave mode energy reflected by the wall 87 along a relatively short path 89 is again converted and reflected, this time by a third mode converting wall 91 which defines a relatively long shear wave mode propagation path 93 that is generally parallel to the path 85. The propagating energy is then reflected and converted back to a longitudinal or compressional mode along a relatively short parth 95 by the wall 81 toward the output transducer 75. Again, the design is to provide for the propagation of acoustic wave energy in the body to be mostly accomplished in the shear wave mode which exhibits less attenuation (but with the same frequency dependence) than the longitudinal wave mode. As in the first two embodiments, at least one of the mode converting walls 81, 87, 91 is processed to provide a relatively low frequency dependent attenuation thereat by way of surface treating or plating. For example, in this embodiment, only the mode converting wall 81 may be provided with a thin deposit of metal 97.

Figure 5:
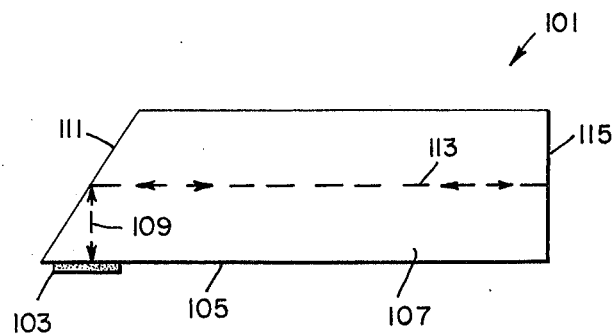
FIG. 5 is a single transducer embodiment, shown schematically.

Referring now to FIG. 5, there is shown yet another embodiment of the invention herein identified as 101. This delay line utilizes a single transducer 103 disposed on a planar surface 105 of a body 107. The transducer functions as both an input and output transducer to generate and receive longitudinal wave mode energy along a relatively short path 109. Energy in this path is reflected and converted by an angularly disposed mode converting wall 111 to define an overall L-shaped path, the major leg of which is a shear wave mode path 113. Shear wave mode energy incident at the end of the path at a planar end surface 115 is reflected back along the path 113 without a change of modes because the end wall 115 is disposed perpendicular to the path 113. The mode converting wall 111 is either machined, chemically treated or plated in order to provide the relatively low frequency dependent attenuation necessary to effectively suppress the spurious triple transit energy while not significantly degrading the desired wide band frequency response of the device. As in all of the embodiments herein described, the device is preferably operated so that the temperature of the body is in the region of about one-fifth the Debye temperature of the particular body material used. This lessens the frequency ($f^2$) dependent attenuation as compared to the relatively less frequency dependent attenuation provided by the mode conversion disturbance means provided at at least one of the mode converting walls.

From the foregoing it can be seen that the invention provides a very unique wide band bulk acoustic wave delay line that exhibits low overall attenuation with good triple transit suppression.

It should be understood that although certain materials and configurations have been specified in detail, other materials and configurations exhibiting similar characteristics may be utilized within the contemplation of the invention.

What is claimed is:

1. A wide band bulk acoustic wave delay line, comprising:

a body of material capable of supporting propagating longitudinal and shear wave modes of acoustic energy, said body including at least one longitudinal-shear wave mode converting wall defining a relatively long but relatively low-attenuation per unit time shear wave mode propagation path within said body angularly disposed with respect to the plane of said mode converting wall;

transducer means disposed on said body for converting electromagnetic wave energy to acoustic wave energy and the converse thereof, and for directing and receiving propagating longitudinal wave mode acoustic energy to and from said mode converting wall along relatively short but relatively higher attenuation per unit time longitudinal wave mode propagation paths within said body angularly disposed with respect to said plane of said mode converting wall and to said shear wave mode propagation path, the attenuation of said propagating acoustic wave energy in said body being relatively frequency dependent; and mode conversion disturbance means in said mode propagation paths and associated with said mode converting wall for relatively frequency-independently increasing the attenuation of said propagating acoustic wave energy at said mode converting wall.

2. The delay line according to claim 1, wherein said conversion disturbance means includes irregularities in the surface of the planar mode converting wall.

3. The delay line according to claim 2, wherein said irregularities are mechanical abrasion produced.

4. The delay line according to claim 2, wherein said irregularities are chemically etched.

5. The delay line according to claim 2, wherein said irregularities are ion beam machinings.

6. The delay line according to claim 1, wherein said conversion disturbance means includes a layer disposed on the surface of the planar mode converting wall.

7. The delay line according to claim 6, wherein said layer is a film deposition.

8. The delay line according to claim 7, wherein said deposition is a metal.

9. The delay line according to claim 7, wherein said deposition is a dielectric material.

10. The delay line according to claim 1, also comprising cooling means associated with said body for cooling said body to at least approximately one-fifth the Debye temperature of the material of said body.

11. The delay line according to claim 10, wherein said body is magnesium aluminum spinel, and wherein said cooling means maintains said body below approximately 180° K.

12. The delay line according to claim 1, wherein said transducer means includes a single transducer for both transmitting and receiving said acoustic wave energy.

13. The delay line according to claim 12, wherein said body includes a single mode converting wall and an oppositely disposed planar reflecting wall orthogonal to said shear wave mode propagation path, said acoustic wave energy propagating along said path in opposite directions.

14. The delay line according to claim 1, wherein said body includes at least one mode converting wall and wherein said transducer means includes an input transducer and an output transducer neither of which is disposed on a mode converting wall.

15. The delay line according to claim 14, wherein said transducers are disposed at opposite ends of a common planar surface of said body, and wherein said body includes two mode converting walls at opposite ends of said body defining a generally square U-shaped acoustic wave path in said body between said transducers.

16. The delay line according to claim 14, wherein said transducers are disposed at opposite ends of spaced parallel planar surfaces of said body, and wherein said body includes two mode converting walls at opposite ends of said body defining a generally z-shaped acoustic wave path in said body between said transducers.

17. The delay line according to claim 14, wherein said transducers are disposed adjacent each other at one end of a planar surface adjacent a first mode converting wall, and wherein said body includes a pair of approximately oppositely angled mode converting walls at an end of said body opposite said first mode converting wall.

18. The delay line according to claim 1, wherein said body includes a plurality of mode converting walls, and wherein said mode conversion disturbance means is not associated with at least one of said walls.

* * * * *